US010340211B1

(12) United States Patent
Suwankasab et al.

(10) Patent No.: US 10,340,211 B1
(45) Date of Patent: Jul. 2, 2019

(54) SENSOR MODULE WITH BLADE INSERT

(71) Applicant: NXP B.V., Eindhoven (NL)

(72) Inventors: Chanon Suwankasab, Pathumthani (TH); Amornthep Saiyajitara, Bangkok (TH); Chayathorn Saklang, Bangplee (TH); Stephen Ryan Hooper, Mesa, AZ (US)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/922,873

(22) Filed: Mar. 15, 2018

(51) Int. Cl.
*H01L 23/495* (2006.01)
*H01L 21/56* (2006.01)
*G01P 1/02* (2006.01)
*H01L 25/16* (2006.01)
*H01L 23/31* (2006.01)
*H01L 23/00* (2006.01)
*H01L 25/00* (2006.01)
*H01L 23/02* (2006.01)
*H01L 21/52* (2006.01)
*G01P 15/00* (2006.01)

(52) U.S. Cl.
CPC ........ *H01L 23/49541* (2013.01); *G01P 1/023* (2013.01); *H01L 21/52* (2013.01); *H01L 21/565* (2013.01); *H01L 23/02* (2013.01); *H01L 23/3121* (2013.01); *H01L 23/49503* (2013.01); *H01L 23/49575* (2013.01); *H01L 24/48* (2013.01); *H01L 25/165* (2013.01); *H01L 25/50* (2013.01); *G01P 15/00* (2013.01); *H01L 24/32* (2013.01); *H01L 24/45* (2013.01); *H01L 24/73* (2013.01); *H01L 24/83* (2013.01); *H01L 24/85* (2013.01); *H01L 2224/32245* (2013.01); *H01L 2224/45144* (2013.01); *H01L 2224/45147* (2013.01); *H01L 2224/45565* (2013.01); *H01L 2224/45664* (2013.01); *H01L 2224/48247* (2013.01); *H01L 2224/73265* (2013.01); *H01L 2224/92247* (2013.01); *H01L 2924/1433* (2013.01); *H01L 2924/1461* (2013.01); *H01L 2924/19105* (2013.01)

(58) Field of Classification Search
CPC ............ H01L 21/565; H01L 23/49541; H01L 23/3135; G01L 19/0092; G01L 2019/0053
See application file for complete search history.

(56) References Cited

U.S. PATENT DOCUMENTS

| | | | |
|---|---|---|---|
| 5,070,732 A | 12/1991 | Duncan et al. | |
| 5,341,684 A | 8/1994 | Adams et al. | |
| 5,783,748 A | 7/1998 | Otani | |
| 6,212,946 B1 * | 4/2001 | Naegele ............... | G01D 11/245 374/E1.026 |
| 7,155,975 B2 | 1/2007 | Mitani et al. | |
| 7,331,212 B2 | 2/2008 | Manlove et al. | |

(Continued)

*Primary Examiner* — Jose R Diaz

(74) *Attorney, Agent, or Firm* — Charles E. Bergere

(57) ABSTRACT

A sensor module, such as an acceleration sensor module, includes a leaded socket assembly covered by a housing. The leaded socket assembly includes a dual gauge lead frame, a sensor die, and various passive devices. The sensor die and the passive devices are mounted on the lead frame, and then the lead frame, sensor die, and passive devices are over-molded to form the leaded socket assembly. Neither the sensor module nor the socket assembly includes a printed circuit board, so many conventional sensor module assembly steps are bypassed.

20 Claims, 5 Drawing Sheets

(56) References Cited

U.S. PATENT DOCUMENTS

| | | | | |
|---|---|---|---|---|
| 8,966,975 B2* | 3/2015 | Campbell | ......... | B29C 45/14655 |
| | | | | 280/735 |
| 2008/0287008 A1* | 11/2008 | Watanabe | ............. | B29C 33/123 |
| | | | | 439/620.25 |
| 2010/0223995 A1* | 9/2010 | Watanabe | ............. | B81B 7/0064 |
| | | | | 73/431 |
| 2015/0253349 A1 | 9/2015 | Eiyama | | |
| 2015/0268261 A1* | 9/2015 | Murray, Jr. | ........ | H01R 13/6683 |
| | | | | 73/493 |

* cited by examiner

SENSOR MODULE WITH BLADE INSERT

BACKGROUND

The present invention generally relates to sensor modules, and, more particularly, to a sensor module with a blade insert and a method of assembly therefor.

Vehicle crash detection systems use electronic sensors, such as pressure sensors and acceleration sensors, to detect impact of a vehicle with another object or vehicle. The sensors are mounted in modules, and the modules are located in crush zones of the vehicle. For example, air bag deployment systems typically employ a multitude of sensors for sensing longitudinal and/or lateral acceleration (or deceleration). Pressure sensors are generally located in the vehicle door crush zone, while acceleration sensors are located in a rigid beam, such as an A-pillar of the vehicle.

FIG. 1A is a flow chart illustrating a conventional process 10 for assembling an acceleration sensor module. In a first step 12, a sensor die is packaged, such as in a Quad Flat No-leads (QFN) type package 20, as shown in FIG. 1B. Such packaging typically involves mounting the die on a flag of a lead frame, electrically connecting the die to leads of the lead frame, over-molding, and singulation. Next, at step 14, a PCB assembly 22 is formed by mounting the packaged sensor die 20 on a printed circuit board (PCB) 24, along with a plurality of passive devices 26, such as resistors and capacitors, as shown in FIG. 1C. The PCB 24 also includes blade type leads 28 that extend from the PCB 24. Thus, the sensor die, the passive devices 26, and the leads 28 are connected by wiring within the PCB 24. At step 16, a socket-assembly 30 is formed by attaching or mounting the PCB assembly within an enclosure 32, as shown in FIG. 1D. Finally, at step 18, a housing 34 is formed around the socket-assembly 30, to form a sensor module 36, where the leaded socket assembly 30 is located in a recessed chamber within the housing 34, as shown in FIG. 1E.

The sensor module 36 may then be bolted or otherwise attached to a vehicle, and the leads 30 plugged into an electrical interface connector (not shown). While this assembly process is well known, there are many steps required to form the final sensor module. Accordingly, it would be advantageous to have a more efficient assembly process.

BRIEF DESCRIPTION OF THE DRAWINGS

So that the manner in which the features of the present invention can be understood in detail, a detailed description of the invention is provided below with reference to embodiments, some of which are illustrated in the appended drawings. It is to be noted that the appended drawings illustrate only typical embodiments of the invention and are therefore not to be considered limiting of its scope, for the invention may admit to other equally effective embodiments. The drawings are for facilitating an understanding of the invention and thus are not necessarily drawn to scale, and some features may be omitted in order to highlight other features of the invention so that the invention may be more clearly understood. Advantages of the subject matter claimed will become apparent to those skilled in the art upon reading this description in conjunction with the accompanying drawings, in which like reference numerals have been used to designate like elements, and in which:

DETAILED DESCRIPTION

In one embodiment, the present invention provides a sensor module, including a dual gauge lead frame. The lead frame includes a die pad, and a plurality of lead fingers spaced around the die pad and extending generally perpendicularly thereto. Each of the lead fingers has a proximal end near to the die pad and a distal end farther from the die pad. The lead frame also includes two or more blade-type leads having proximal ends connected to the distal ends of two or more of the plurality of lead fingers. The die pad and the plurality of lead fingers have a first thickness and the blade-type leads have a second thickness that is greater than the first thickness. A first semiconductor die is attached on a top surface of the die pad, and first electrical connections connect electrodes on an active surface of the first semiconductor die to the proximal ends of respective ones of the plurality of lead fingers. A plurality of passive devices are mounted on and connected across respective pairs of the plurality of lead fingers. A mold compound encapsulates the die pad, the first semiconductor die, the plurality of passive devices, the first electrical connections, and the proximal ends of the plurality of lead fingers and the two or more blade-type leads. The mold compound forms a generally rectangular molded body. In one embodiment, the sensor module includes a sensor housing within which the molded body and the distal ends of the plurality of lead fingers are encased.

In another embodiment, the present invention provides a method of assembling a sensor module, including the step of providing a dual gauge lead frame, where the dual gauge lead frame includes a die pad and a plurality of lead fingers spaced around the die pad and extending generally perpendicularly thereto. Each of the lead fingers has a proximal end near to the die pad and a distal end farther from the die pad. The lead frame also includes two or more blade-type leads connected to the distal ends of two or more of the plurality of lead fingers. The die pad and the plurality of lead fingers have a first thickness and the blade-type leads have a second thickness that is greater than the first thickness. The method also includes attaching a first semiconductor die to the die pad, and electrically connecting electrodes on an active surface of the first semiconductor die to the proximal ends of respective ones of the plurality of lead fingers. A plurality of passive devices are mounted on and electrically connected across respective pairs of the plurality of lead fingers. The die pad, the first semiconductor die, the passive devices, the electrical connections, and the proximal ends of the plurality of lead fingers and the two or more blade-type leads are covered with a mold compound, thereby forming a generally rectangular molded body. In one embodiment, the method also includes encasing the molded body assembly within a sensor housing, thereby providing a sensor module.

Figure 2:
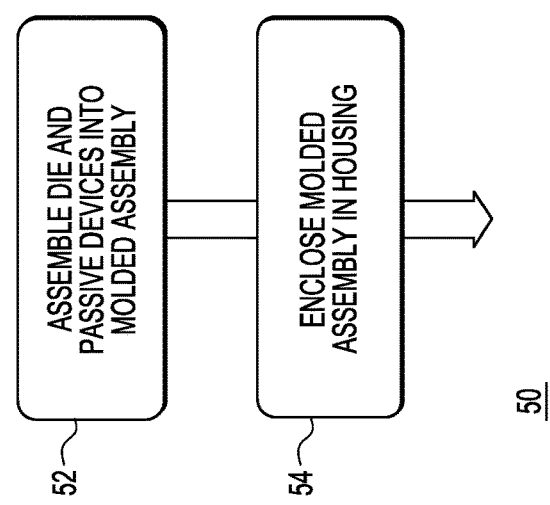
FIG. 2 is a flow chart of a sensor module assembly process in accordance with an embodiment of the present invention.

Referring now to FIG. 2, a flow chart of a sensor module assembly process 50 in accordance with an embodiment of the present invention is shown. As previously discussed, conventional sensor modules are assembled by attaching a packaged sensor die, along with other devices (e.g., passive devices) to a PCB, and then placing the PCB into a socket assembly, and finally encasing the socket assembly in a sensor housing. In order to more efficiently assemble a sensor module, the present invention attaches a die to a die pad of a lead frame (similar to packaging the die), however, the lead frame is designed for forming a sensor assembly that can be encased in a housing, which allows the separate packaging of the sensor die and PCB mounting to be bypassed. Accordingly, sensor modules of the present invention can be assembled with few steps, lower cost, and more quickly.

In a first step 52, a sensor die and passive devices are attached to a lead frame and then encapsulated, forming a molded body having two or more blade-type leads extending therefrom. Preferably the blade-type leads extend from just one side of the molded body. There also are a plurality of lead fingers that extend from one or more of the other sides of the molded body. These lead fingers are used for testing the sensor die assembly. In a second step, 54, the molded body is encased in a sensor housing, thereby forming a sensor module.

Figure 3:
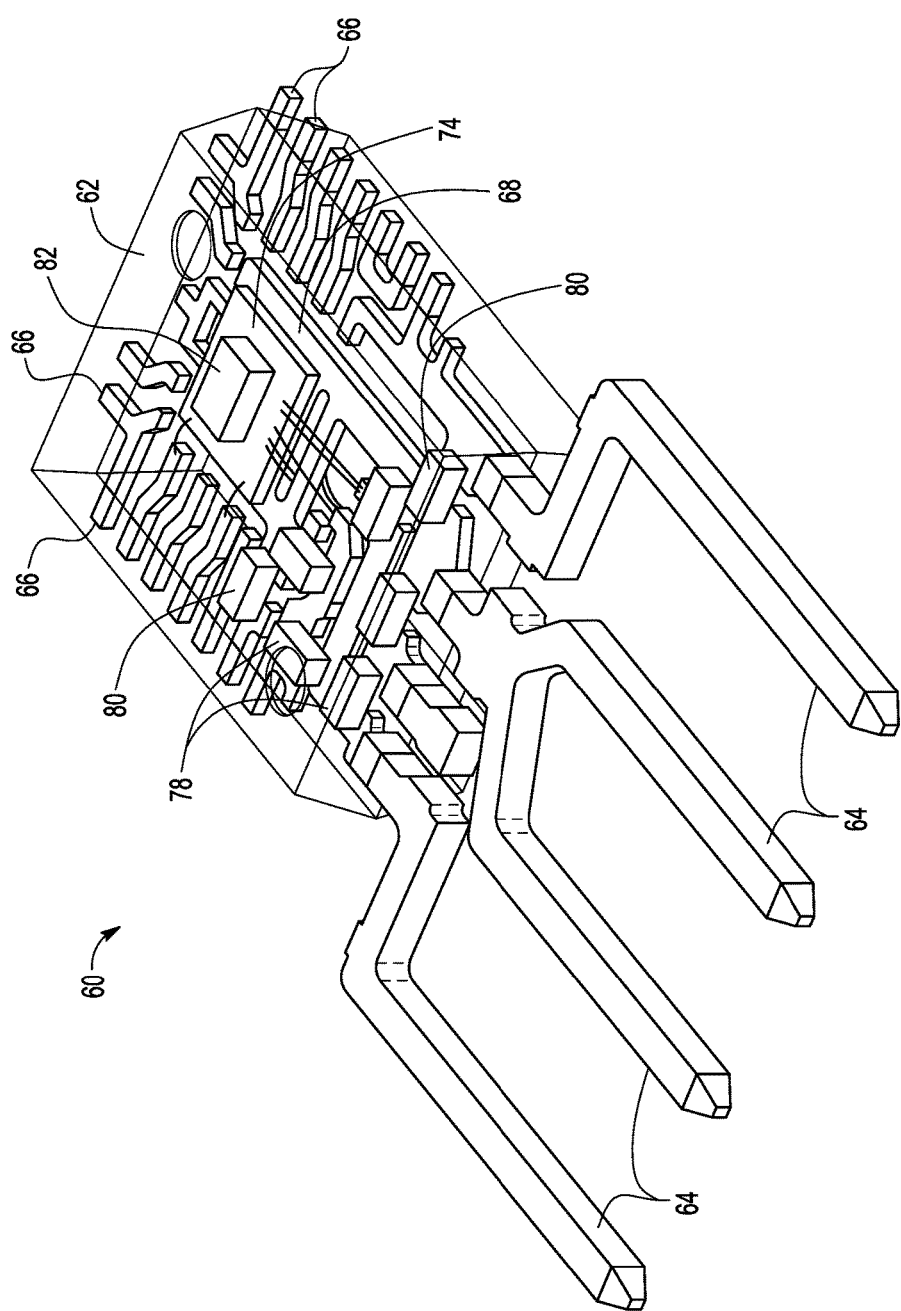
FIG. 3 is a greatly enlarged, transparent, perspective view of a leaded socket assembly in accordance with an embodiment of the present invention.
Figure 4:
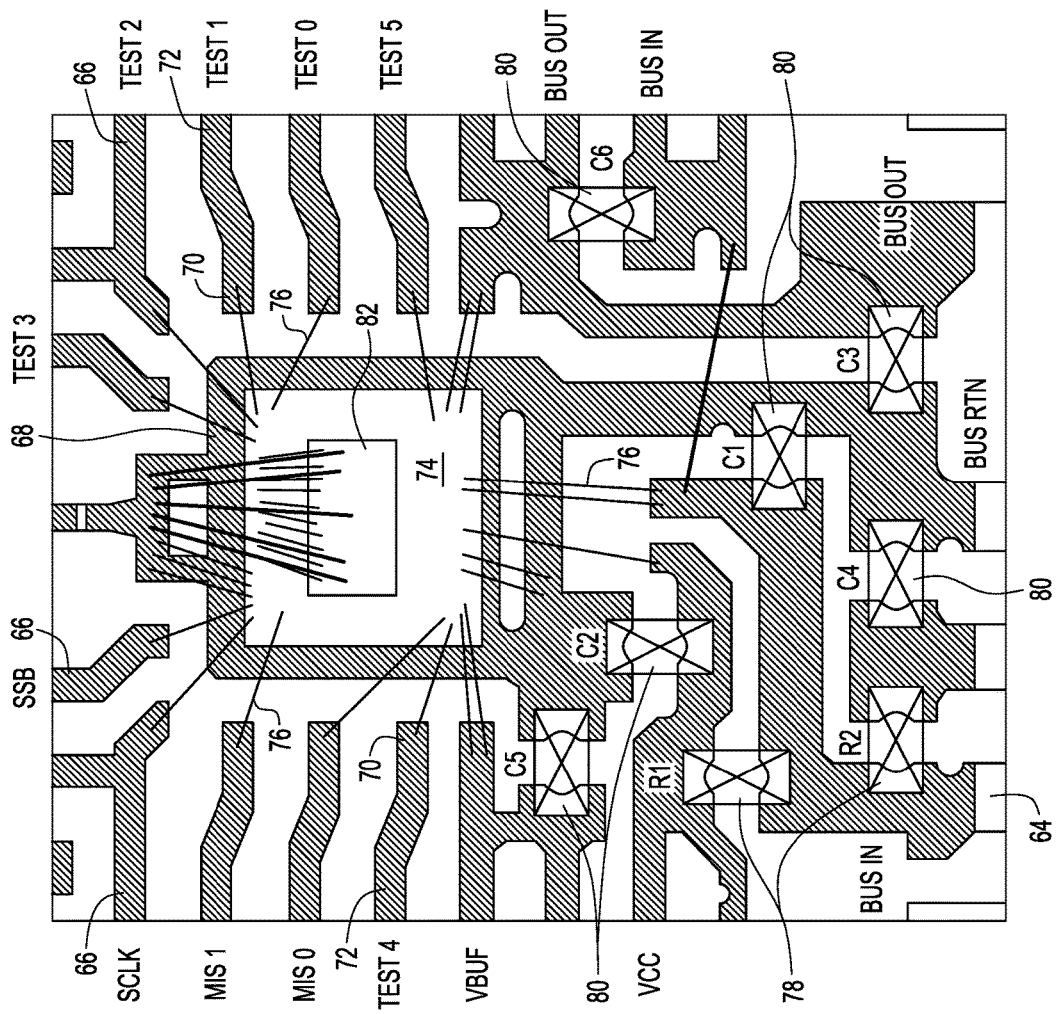
FIG. 4 is a top plan view of a partially assembled leaded socket assembly in accordance with an embodiment of the present invention.

The steps 52 and 54 will be broken down and described in more detail hereinafter with reference to FIGS. 3 and 4, where FIG. 3 shows a greatly enlarged, transparent, perspective view of a leaded socket assembly 60 in accordance with an embodiment of the present invention, and FIG. 4 shows a top plan view of the leaded socket assembly 60 in a partially assembled state. The socket assembly 60 comprises a molded body 62 and two or more blade-type leads 64 that extend outwardly from the molded body 62. In the embodiment shown, there are four blade-type leads 64. However, there may be fewer or more of such leads, such as two, six, or even more that six. In the presently preferred embodiment, the molded body 62 is generally rectangular in shape and the bladed-type leads 64 extend only from one side of the molded body 62.

In one embodiment, the molded body 62 comprises an epoxy-resin composition, for example a C-stage plastic material (resite), that has been cured to be physically hard to protect elements covered thereby from potential environmental influences like moisture and dust, as well as mechanical damage. The molded body 62 may be formed using known methods, such as transfer molding.

There also are a plurality of lead fingers 66 that also extend outwardly from the molded body 62. It is preferred that the lead fingers 66 extend from one or more other sides of the molded body 62, and in the embodiment shown in FIG. 3, the plurality of lead fingers 66 extend from or are exposed on three lateral sides of the molded body 62, which are different from the side from which the blade-type leads 64 extend from the molded body 62. In the presently preferred embodiment, the blade-type leads 64 are used to transmit and receive functional signals, while the plurality of lead fingers 66 are used to transmit and receive test signals. It also should be noted that in the presently preferred embodiment, the plurality of lead fingers 66 extend a first distance from the molded body 62 and the blade-type leads 64 extend a second distance from the molded body 62, where the second distance is greater than the first distance. In one embodiment, the first distance is less than about 1.0 mm and the second distance is less than about 10.0 mm. The difference between the first and second distances is a preference, not a requirement. Also, the first distance could be 0 mm, in which case the test leads would be flush with the mold body, like QFN package leads.

The blade-type leads 64 and the plurality of lead fingers 66 are part of a dual gauge lead frame. The dual gauge lead frame also includes a die pad 68. The lead fingers 66 are spaced around the die pad 68 and extend generally perpendicularly thereto. Each of the lead fingers 66 has a proximal end 70 near to the die pad 68 and a distal end 72 farther from the die pad 68. In one embodiment, the proximal ends of the blade-type leads 64 are connected to the distal ends 72 of selected ones of the lead fingers 66, and in the presently preferred embodiment, the blade-type leads 64 are integral with the selected lead fingers 66. The lead frame is called a dual gauge lead frame because the blade-type leads 64 are thicker than the lead fingers 66 and the die pad 68. That is, the die pad 68 and the plurality of lead fingers 66 have a first thickness and the blade-type leads 64 have a second thickness that is greater than the first thickness. In one embodiment, the first thickness is about 0.25 mm and the second thickness is less than or equal to about 0.64 mm.

A first semiconductor die 74 is attached to the die pad 68, such as with a die attach epoxy. In the presently preferred embodiment, the first die 74 has a bottom side attached to the die pad 68, and an exposed, top active side. The die top side has a plurality of electrodes that allow for providing power, ground, and signals to the integrated circuit therein, and for receiving signals therefrom. The die electrodes are electrically connected to the proximal ends 70 of respective ones of the plurality of lead fingers 66 with bond wires 76 using known wire bonding processes and commercially available wire bonding machines. The bond wires 76 may comprise commercially available copper or gold wires. In the presently preferred embodiment, the bond wires 76 are coated with palladium, which prevents oxidation and allows for good bonds.

A plurality of passive devices, including for example resistors 78 and capacitors 80 are connected across respective pairs of the plurality of lead fingers 66 in order to manage voltages and currents to and from the first die 74.

In one embodiment, a second semiconductor die 82 is mounted on and attached to the top surface of the first semiconductor die 74, such as with a die attach epoxy. The second die 82 is electrically connected to electrodes on the top surface of the first die 74 and/or the proximal ends of selected ones of the lead fingers 66, with bond wires 76. In the presently preferred embodiment, the first die 74 is an application specific integrated circuit (ASIC) and the second die 82 is an acceleration sensor, such as a Micro-Electro-Mechanical Systems (MEMS) sensor.

In the first step 52, after attaching the first die 74 to the die pad and the second die 82 to the first die 74, and electrically connecting the dies 74, 82 to each other and to the selected ones of the lead fingers 66, the die pad 68, the first and second dies 74, 82, the passive devices 78, 80, the electrical connections (i.e., bond wires 76), and the proximal ends 70 of the lead fingers 66 and the blade-type leads 64 are covered or encapsulated with a mold compound to thereby form the molded body 62.

The distal ends 72 of the lead fingers 66 extend outwardly from the molded body 62, as do the blade-type leads 64. As can be seen in FIG. 3, the lead fingers 66 just extend from the molded body 62, while the blade-type leads 64 are predominantly outside of the molded body 72, with just the portions thereof that are connected to the distal ends 72 of the selected ones of the lead fingers 66 being covered by the mold compound. As previously noted, the lead fingers 66 are used for test signals and the blade-type leads 64 are used for power, ground and functional signals to and from the first and second dies 74, 82. The lead frame may comprise copper and at least the exposed portions of the lead fingers 66 and blade-type leads 64 is plated with a metal or a metal alloy, such as tin or gold.

Figure 5A:
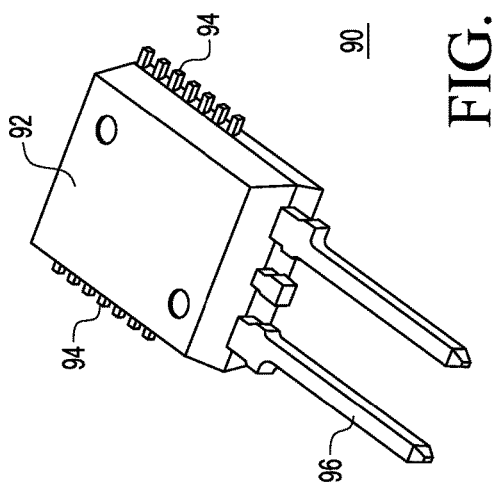
FIGS. 5A and 5B are front and back perspective views of a leaded socket assembly in accordance with an embodiment of the present invention.
Figure 5B:
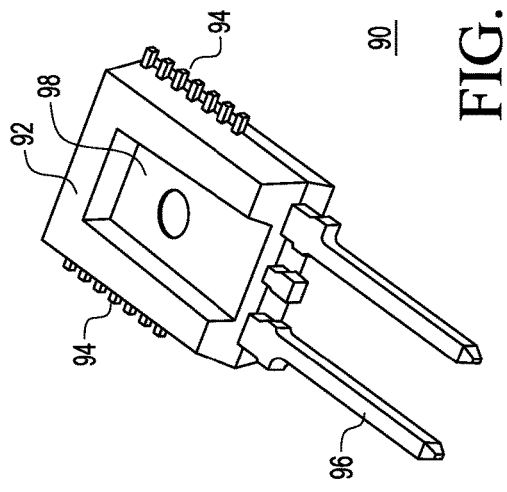

FIGS. 5A and 5B are front and back perspective views of a leaded socket assembly 90 in accordance with an embodiment of the present invention. The leaded socket assembly 90 comprises a molded body 92, test pins 94, and two blade-type leads 96. The test pins 94 are the distal ends of the lead fingers that project from the molded body 92. Although not visible, there are additional test pins 94 along the back face of the assembly 90. Also, as shown in FIG. 5B, the molded body 90 includes a slot 98 to match with a die insertion tool used when encasing the assembly 90 in a housing, as will be discussed with reference to FIG. 7.

Figure 6A:
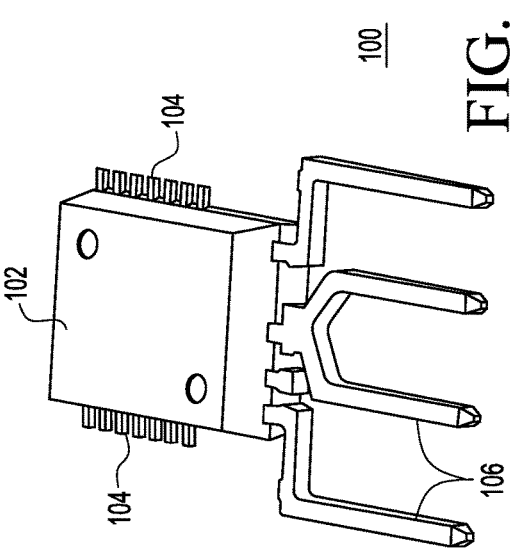
FIGS. 6A and 6B are front and back perspective views of a leaded socket assembly in accordance with another embodiment of the present invention.
Figure 6B:
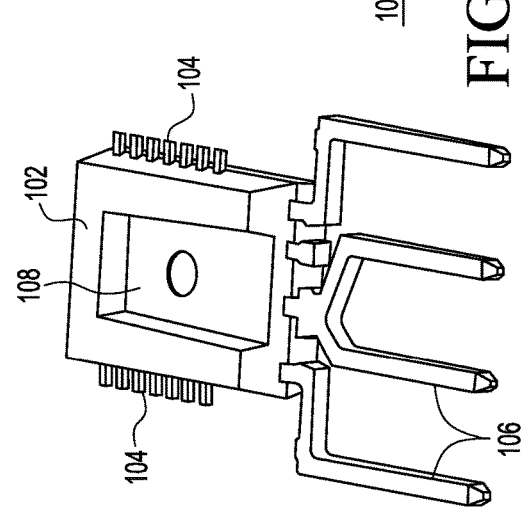

FIGS. 6A and 6B are front and back perspective views of a leaded socket assembly 100 in accordance with an embodiment of the present invention. The leaded socket assembly 100 comprises a molded body 102, test pins 104, and four blade-type leads 106. The test pins 104 are the distal ends of the lead fingers that project from the molded body 102. Although not visible, there may be additional test pins 104 along the back face of the assembly 100. Also, as shown in FIG. 6B, the molded body 100 includes a slot 108 to match with a die insertion tool used when encasing the assembly 100 in a housing, as will be discussed with reference to FIG. 7. Also, as shown in FIGS. 3, 6A and 6B, the blade-type leads 64 include a bend such that they do not extend in a straight line out of the molded body 62. The leads 64 are spread out at their distal ends and narrow toward the molded body at near their proximal ends.

Figure 1C:
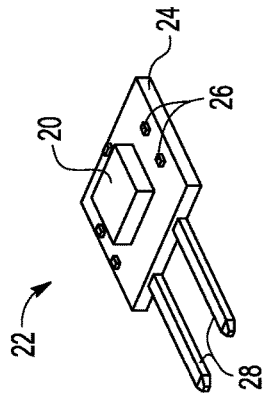
FIG. 1C is a perspective view of the QFN device of FIG. 1B mounted on a PCB.
Figure 1E:
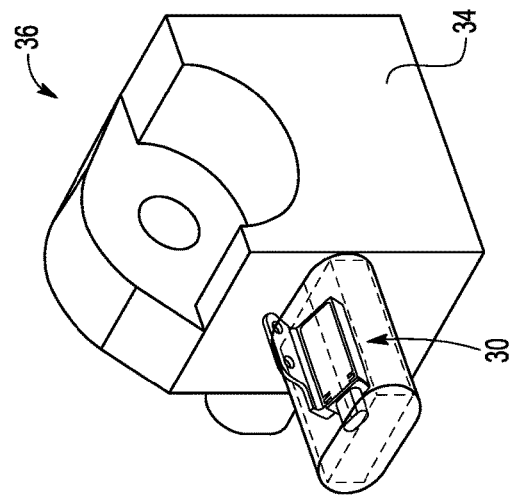
FIG. 1E is a transparent perspective view of sensor module showing the socket assembly of FIG. 1D located within a housing.
Figure 1B:
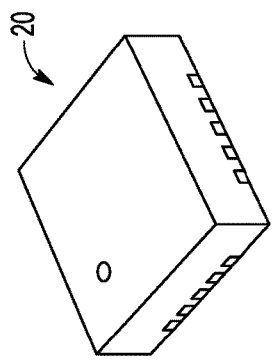
FIG. 1B is a perspective view of an acceleration sensor packaged as a QFN device.
Figure 1D:
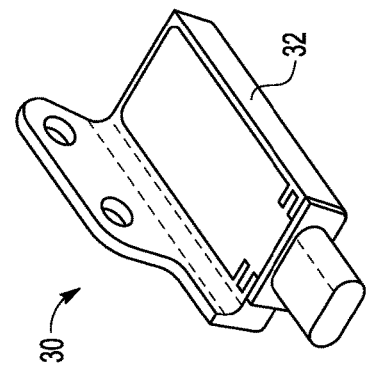
FIG. 1D is a perspective view of a socket assembly including the PCB assembly of FIG. 1C.
Figure 1A:
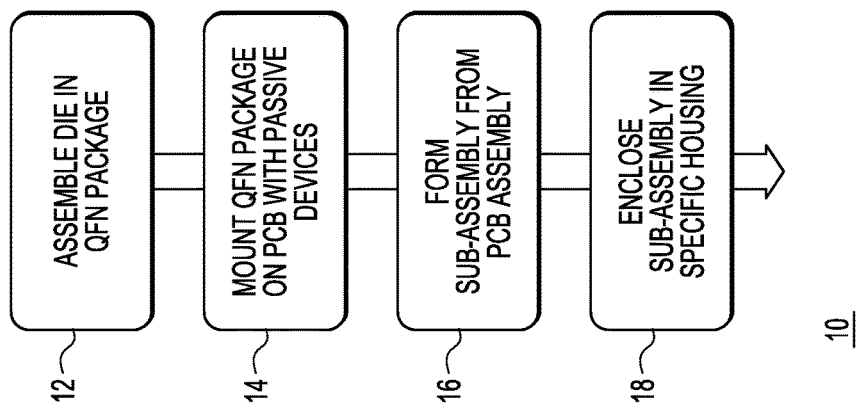
FIG. 1A is a flow chart of a conventional sensor module assembly process.
Figure 7:
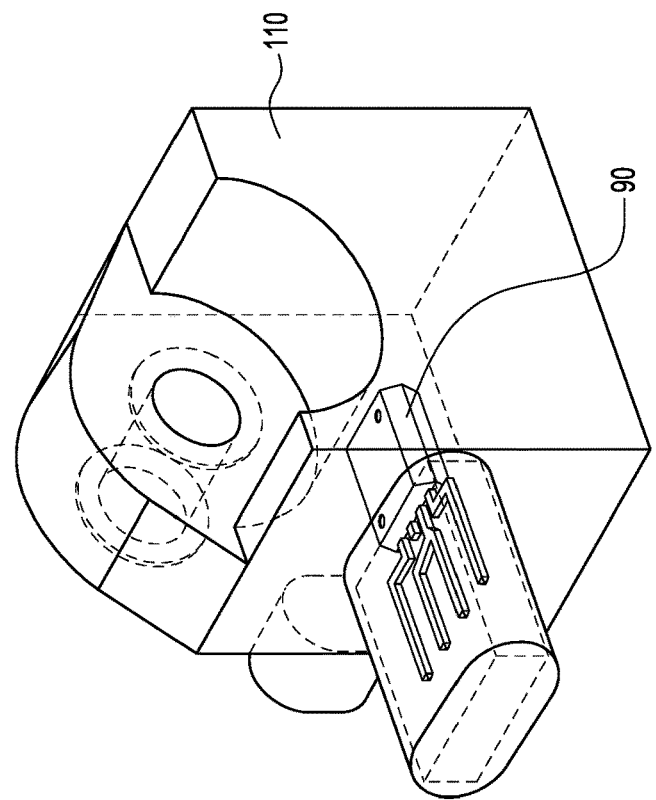
FIG. 7 is a transparent perspective view illustrating the leaded socket assembly of FIG. 3 encased in a housing, in accordance an embodiment of the present invention.

FIG. 7 is a transparent perspective view illustrating the leaded socket assembly 90 of FIGS. 5A and 5B encased in a housing 110, in accordance an embodiment of the present invention. The housing 110 protects and shields the assembly 90, and allows the assembly to be fitted at desired locations, such as in desired locations of an automobile. The housing 110 may be formed around the assembly 90 using a custom mold tool. Alternatively, the housing may comprise two or more mating pieces that have a cavity within for receiving the assembly 90.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Use of the term "about" when referring to a dimension means within plus or minus 10% of the given value.

Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A sensor module, comprising:
 a dual gauge lead frame, the lead frame including:
  a die pad,
  a plurality of lead fingers spaced around the die pad and extending generally perpendicularly thereto, wherein each of the lead fingers has a proximal end near to the die pad and a distal end farther from the die pad, and
  two or more blade-type leads having proximal ends connected to the distal ends of two or more of the plurality of lead fingers, wherein the die pad and the plurality of lead fingers have a first thickness and the blade-type leads have a second thickness that is greater than the first thickness;
 a first semiconductor die attached on a top surface of the die pad;
 first electrical connections connecting electrodes on an active surface of the first semiconductor die to the proximal ends of respective ones of the plurality of lead fingers;
 a plurality of passive devices, each passive device mounted on and connected across respective pairs of the plurality of lead fingers;
 a mold compound covering the die pad, the first semiconductor die, the plurality of passive devices, the first electrical connections, and the proximal ends of the plurality of lead fingers and the two or more blade-type leads, wherein the mold compound forms a generally rectangular molded body.

2. The sensor module of claim 1, wherein the blade-type leads extend only from one side of the molded body.

3. The sensor module of claim 2, wherein the plurality of lead fingers extend from one other side of the molded body.

4. The sensor module of claim 3, wherein the blade-type leads transmit and receive functional signals and the plurality of lead fingers transmit and receive test signals.

5. The sensor module of claim 3, wherein the plurality of lead fingers extend a first distance from the molded body and the blade-type leads extend a second distance from the molded body that is greater than the first distance.

6. The sensor module of claim 5, wherein the first distance is less than 1 mm and the second distance is less than 10 mm.

7. The sensor module of claim 2, wherein the plurality of lead fingers extend from at least two other sides of the molded body.

8. The sensor module of claim 1, wherein the proximal ends of the blade-type leads are integral with the distal ends of the two or more of the plurality of lead fingers.

9. The sensor module of claim 1, wherein the first thickness is about 0.25 mm and the second thickness is less than 0.64 mm.

10. The sensor module of claim 1, wherein at least the distal ends of the lead fingers and the blade-type leads are plated with a metal or a metal alloy.

11. The sensor module of claim 1, further comprising a sensor housing within which the molded body and the distal ends of the plurality of lead fingers are encased.

12. The sensor module of claim 1, further comprising:
a second semiconductor die attached on a top side of the first semiconductor die; and
second electrical connections connecting the second semiconductor die to at least one of the first semiconductor die and at least one of the lead fingers,
wherein the first semiconductor die comprises an application specific integrated circuit (ASIC) and the second semiconductor die comprises an acceleration sensor.

13. The sensor module of claim 1, wherein the first and second electrical connections comprise bond wires.

14. A method of assembling a sensor module, the method comprising:
providing a dual gauge lead frame, the lead frame including:
a die pad,
a plurality of lead fingers spaced around the die pad and extending generally perpendicularly thereto, wherein each of the lead fingers has a proximal end near to the die pad and a distal end farther from the die pad, and
two or more blade-type leads connected to the distal ends of two or more of the plurality of lead fingers, wherein the die pad and the plurality of lead fingers have a first thickness and the blade-type leads have a second thickness that is greater than the first thickness;
attaching a first semiconductor die to the die pad;
electrically connecting electrodes on an active surface of the first semiconductor die to the proximal ends of respective ones of the plurality of lead fingers;
mounting and electrically connecting a plurality of passive devices across respective pairs of the plurality of lead fingers; and
covering the die pad, the first semiconductor die, the passive devices, the electrical connections, and the proximal ends of the plurality of lead fingers and the two or more blade-type leads with a mold compound, thereby forming a generally rectangular molded body.

15. The method of claim 14, wherein the blade-type leads extend only from one side of the molded body.

16. The method of claim 15, wherein the plurality of lead fingers extend from one other side of the molded body.

17. The method of claim 16, wherein the plurality of lead fingers extend a first distance from the molded body and the blade-type leads extend a second distance from the molded body that is greater than the first distance.

18. The method of claim 14, wherein the proximal ends of the blade-type leads are attached to the distal ends of respective ones of the plurality of lead fingers.

19. The method of claim 14, further comprising encasing the molded body in a housing, thereby forming the sensor module.

20. The method of claim 14, further comprising:
attaching a second semiconductor die on a top side of the first semiconductor die; and
electrically connecting the second semiconductor die to at least one of the first semiconductor die and at least one of the lead fingers,
wherein the first semiconductor die comprises an application specific integrated circuit (ASIC) and the second semiconductor die comprises an acceleration sensor.

\* \* \* \* \*